United States Patent [19]

Minato

[11] Patent Number: 5,086,330
[45] Date of Patent: Feb. 4, 1992

[54] BIPOLAR SEMICONDUCTOR SWITCHING DEVICE

[75] Inventor: Tadaharu Minato, Itami, Japan

[73] Assignee: Mitsubishi Denki Kabushiki Kaisha, Tokyo, Japan

[21] Appl. No.: 445,163

[22] Filed: Dec. 6, 1989

Related U.S. Application Data

[63] Continuation of Ser. No. 205,364, Jun. 10, 1988, abandoned.

[30] Foreign Application Priority Data

Feb. 26, 1988 [JP] Japan .................. 63-45115

[51] Int. Cl.$^5$ .................. H01L 29/74; H01L 29/78
[52] U.S. Cl. .................. 357/38; 357/23.4; 357/90
[58] Field of Search .................. 357/23.4, 38, 90

[56] References Cited

U.S. PATENT DOCUMENTS

| | | | |
|---|---|---|---|
| 4,236,169 | 11/1980 | Nakashima et al. | 357/38 |
| 4,511,913 | 4/1985 | Nagano | 357/38 |
| 4,841,345 | 6/1989 | Majumdar | 357/23.4 |

FOREIGN PATENT DOCUMENTS 62-219668 9/1987 Japan .................. 357/23.4

OTHER PUBLICATIONS

Japan Electrical Society Technical Bulletin, Part II, No. 249, Jun. 1987, entitled "Trend of a Self-Arc-Suppressing Type Power Semiconductor Device", pp. 32–67.

*Primary Examiner*—Mark Prenty
*Attorney, Agent, or Firm*—Oblon, Spivak, McClelland, Maier & Neustadt

[57] ABSTRACT

A semiconductor substrate having a buffer region in one major surface with the buffer region having a opening portion of prescribed width and depth. An electrode region is in contact with the substrate through the opening portion and is short-circuited with the buffer region by a contact, so that the voltage breakdown characteristics of the device can be easily adjusted through the adjustment of the width and depth of the opening portion and so that the high speed switching and low "on" resistance characteristics can also be obtained.

5 Claims, 5 Drawing Sheets

BIPOLAR SEMICONDUCTOR SWITCHING DEVICE

This application is a Continuation of application Ser. No. 07/205,364 filed on June 10, 1988, now abandoned.

BACKGROUND OF THE INVENTION

1. Field of the Invention

The present invention relates to a bipolar semiconductor switching device such as a static induction thyristor (hereinafter referred as a SI thyristor), an insulated gate bipolar transistor (hereinafter referred as an IGBT) and a gate turn-off thyristor (hereinafter referred as a GTO) and a manufacturing method thereof.

2. Discussion of Background

Figure 1:
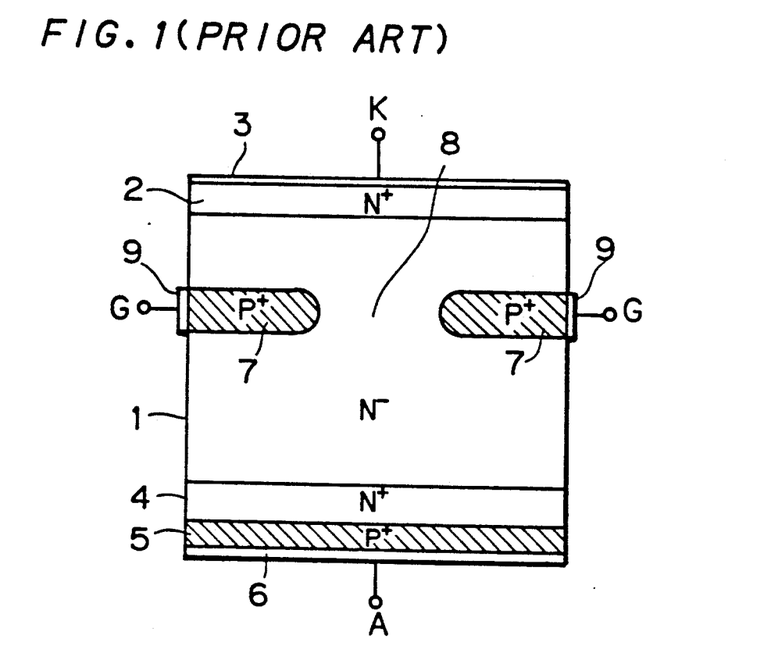
FIG. 1 and FIG. 2 are cross sectional views showing the structures of conventional SI thyristors.
Figure 2:
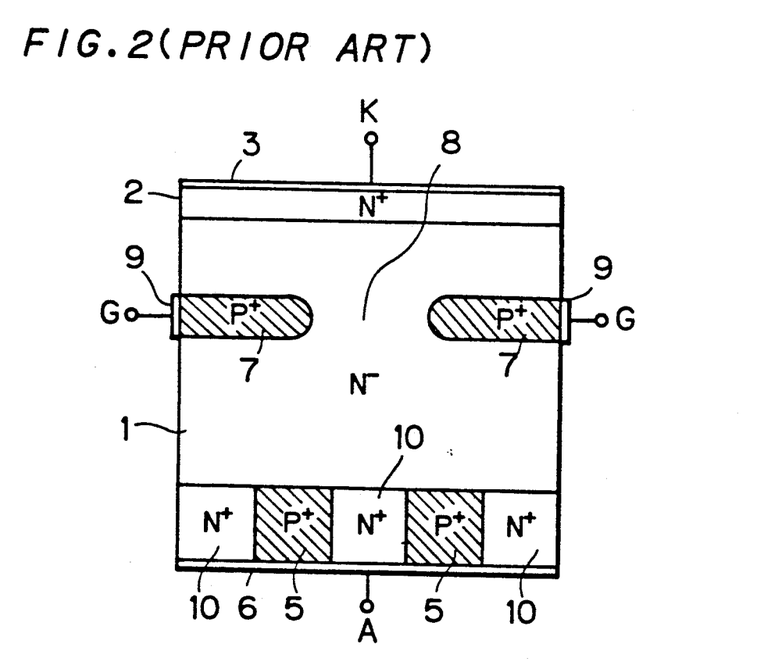

FIG. 1 and FIG. 2 are cross sectional views showing structures of conventional buried single gate SI thyristors. The SI thyristor shown in FIG. 1 is of a buffer layer type, which is suitable for high-voltage breakdown operation, and the SI thyristor shown in FIG. 2 is of a shorted emitter type, which is suitable for high speed switching. Such structures are shown in JAPAN ELECTRICAL SOCIETY TECHNICAL REPORT II-249, June 1987 "Trend of a Self-Arc-Suppressing Type Power Semiconductor Device", for example.

Referring to FIG. 1, a cathode region 2, being an N+type semiconductor layer of relatively high impurity concentration (i.e., relatively low specific resistance) is provided on one surface of an N−type semiconductor substrate 1 of relatively low impurity concentration (i.e., relatively high specific resistance). A metal cathode contact 3 is formed on the cathode region 2, and a cathode terminal K is electrically connected to the cathode contact 3. An N+type buffer layer 4 of relatively low specific resistance is formed on the other surface of the semiconductor substrate 1, and an anode region 5, being a P+type semiconductor layer of relatively low specific resistance, is provided on the buffer layer 4. A metal anode contact 6 is formed on the anode region 5, and an anode terminal A is electrically connected to the anode contact 6. A P+type gate region 7 of relatively low specific resistance is buried in the semiconductor substrate 1. The main current flows from the anode region 5 to the cathode region 2 through a channel region 8 surrounded by the P+type gate region 7. A metal gate contact 9 is formed on the P+type gate region 7, and a gate terminal G is electrically connected to the gate contact 9.

The on/off operation of the SI thyristor is controlled by a forward/reverse bias applied across the cathode and gate terminals K and G. As is well known, a normally on type SI thyristor is in an on-state when a zero bias is applied across the terminals G and K, while it is turned off upon application of a reverse bias. A normally-off type SI thyristor is in an off-state When a zero bias is applied across the terminals G and K, while it is turned on upon application of a forward bias. Although operation of the normally-on type SI thyristor will be hereinafter described as an example, an analogous description exists for a normally-off type SI thyristor.

The main current flows from the anode region 8 to the cathode region 2 through the channel region 8 to maintain the on state of the SI thyristor when a zero or small forward bias is applied across the terminals G and K. In turn-off operation, the channel region 8 is pinched off by a depletion layer spreading from the gate region 7 in response to a reverse bias applied across the terminals and K, to cut off the main current. If the depletion layer reaches the anode region 5, a short circuit is caused across the terminals G and A by the punch through effect. Therefore, an N+type buffer layer 4 is employed in order to suppress the extension of the depletion layer to the anode region 5 By virtue of the N+type buffer layer 4, G-A main breakdown voltage can be increased. Thus, a high voltage breakdown resistant characteristic is obtained.

On the other hand, the SI thyristor shown in FIG. 2 has a structure suitable for high speed switching rather than high breakdown voltage. Referring to FIG. 2, P+type anode regions 5 and N+type shorted emitter regions 10 are alternately provided on one surface of an N−type semiconductor substrate 1. These regions 5 and 10 are short-circuited by an anode contact 6 provided thereon. Other structural components are the same as those of the SI thyristor shown in FIG. 1.

The on/off operation of the SI thyristor of FIG. 2 is basically the same with that shown in FIG. 1. The characteristic operation is such that electrons injected into the substrate 1 from a cathode region 2 directly reach the anode regions 5 and holes are injected into the substrate 1 from the anode regions 5 with high efficiency, in the on state, because the N+type buffer layer 4 shown in FIG. 1 has been deleted. Thus, both the turn-on time and the "on" resistance are reduced. Further, in the turn off transition period, electrons remaining in an undepleted region after the pinch-off of channel region 8 can easily flow into the shorted emitter regions 10, since these regions 10 have a positive potential. Consequently, holes remaining in the same region are rapidly ejected into gate region 7 and the anode regions 5. Thus, the turn-off time is also improved. Thus, high speed switching and low "on" resistance characteristics are obtained.

In conventional power bipolar semiconductor switching devices such as the hereinbefore described SI thyristor, the high voltage breakdown characteristic and the high speed switching characteristic and low "on" resistance characteristic are in a so-called trade off relationship, i.e., a relationship where the particular use of the device requires the adjustment of the priority among the three characteristics, as hereinafter described in detail.

In order to obtain the high speed switching and low "on" resistance characteristics by the SI thyristor having the structure shown in FIG. 1, the impurity concentration of the anode region 5 must be significantly higher than that of the anode regions 5 of the SI thyristor shown in FIG. 2. However, this is difficult to achieve for the following reason. In general, the anode region 5 of the SI thyristor shown in FIG. 1 is formed through one of the following alternative processes: (i) First, the N+type buffer layer 4 is epitaxially grown on one surface of the substrate 1, and then the P+type anode region 5 is epitaxially grown thereon. (ii) First, the N+type buffer layer 4 is epitaxially grown on one surface of the substrate 1, and then P type impurities are diffused into the N+type buffer layer 4 to form the P+type anode region 5. (iii) First, N type impurities are diffused from one surface of the substrate 1 to form the N+type buffer layer 4, and then P type impurities are diffused into the N+type buffer layer 4 to form the P+type anode layer 5.

The processes of the items (i) and (ii) require an epitaxial growth step, and hence they are more difficult to implement and require more time and more expensive than the shorted emitter structure shown in FIG. 2. During the processes (ii) and (iii), the P type anode region 5 must be formed through the step of double diffusion of type impurities into the N+type buffer layer 4 having high impurity concentration, and hence it is difficult to sufficiently enhance the impurity concentration in the anode region. Therefore, SI thyristors having the structure shown in FIG. 1 are invariably suited only for the high breakdown voltage characteristic On the other hand, in order to obtain the high breakdown voltage characteristic by the SI thyristor having the structure shown in FIG. 2, (a) the surface area and the impurity concentration of the anode regions 5 must be reduced to suppress the carrier injection from the anode regions 5, or (b) the N−type substrate 1 must be increased in thickness to accept extension of the depletion layer. In the case of the item (a), the high speed turn-on and the low "on" resistance characteristics are spoiled. In the case of the item (b), the high speed turn-off characteristic is spoiled by increment of the absolute number of surplus carriers in the off state, and the device itself becomes large in thickness. Therefore, the SI thyristor having the structure shown in FIG. 2 is invariably suitable only for high speed switching and low "on" resistance characteristics.

Thus, in the conventional power bipolar semiconductor switching device, the high breakdown voltage characteristics and the high speed switching and low "on" resistance characteristics are incompatible, and hence it is hard to accomplish a trade-off between them.

SUMMARY OF THE INVENTION

A bipolar semiconductor switching device according to the present invention comprises a semiconductor substrate of a first conductivity type having two major surfaces, a first main electrode region of a first conductivity type formed in one major surface of said semiconductor substrate, a buffer region of a first conductivity type of relatively high impurity concentration formed in the other major surface of said semiconductor substrate, said buffer region having an opening portion of prescribed width and depth, a second main electrode region of a second conductivity type being in contact with said semiconductor substrate through said opening portion of said buffer region, a connecting region for electrically connecting said buffer region and said second main electrode region with each other, and a control region for controlling main current flowing across said first and second main electrode regions.

Accordingly, it is an object of the present invention to provide a bipolar semiconductor switching device which has excellent compatibility between a high-voltage breakdown characteristic and high speed switching and low "on" resistance characteristics so that it is easy to make a trade-off between them.

These and other objects, features, aspects and advantages of the present invention will become more apparent form the following detailed description of the present invention when taken in conjunction with the accompanying drawings.

DESCRIPTION OF THE PREFERRED EMBODIMENTS

Figure 3:
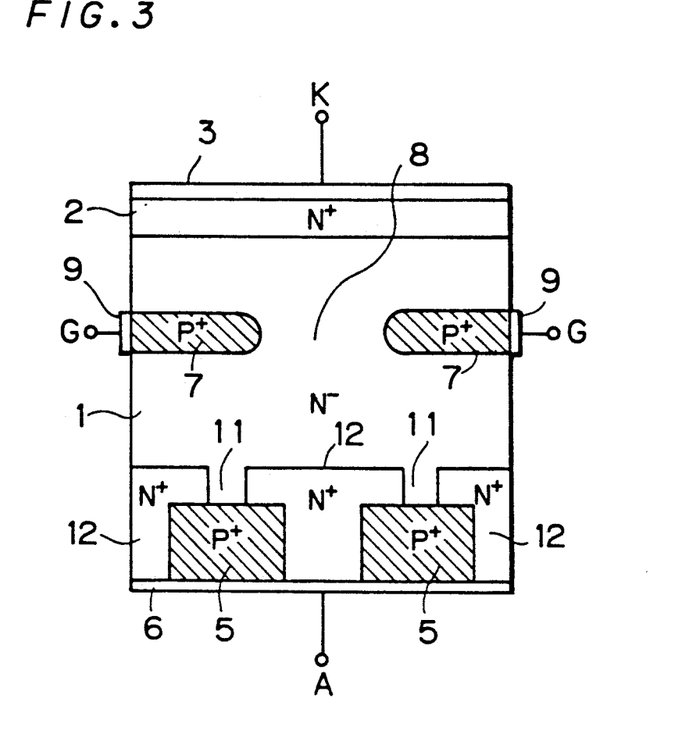
FIG. 3 is a cross sectional view showing the structure of an SI thyristor in accordance with one embodiment of the present invention.

FIG. 3 is a cross sectional view showing the structure of a buried gate type SI thyristor in accordance with an embodiment of a bipolar semiconductor switching device in accordance with the present invention. This SI thyristor has N+type buffer regions 12 which are formed in one major surface of an N−type semiconductor substrate 1. The N+type buffer regions 12 have opening portions of prescribed width and depth. The P+type anode regions 5 are in contact with the N+type semiconductor substrate through the opening portions 11. The P+type anode regions 5 and the N+type buffer regions 12 are electrically connected with each other, i.e., short-circuited, by an anode contact 6 formed thereon. Other structure is the same with that of the conventional SI thyristors shown in FIG. 1 and FIG. 2.

An example of the manufacturing process for the structure in the anode side will be hereinafter described. First, N type impurities are selectively diffused from one surface of the N−type semiconductor substrate 1 to form the N+type buffer regions 12. Then, P type impurities are also selectively diffused from the same surface of the N−type semiconductor substrate 1 to form the P+type anode regions 5. P type impurities are further selectively diffused in the portion where the N+type buffer regions 12 and the P+type anode regions 5 overlap with each other, in order to unify the impurity concentration in the P+type anode regions 5. The anode contact 6 is formed on the P+type anode regions 5 and the N+type buffer regions 12 to electrically connect them with each other.

The on/off operation of the SI thyristor in accordance with this embodiment is basically the same with that of the conventional SI thyristors shown on FIG. 1 and FIG. 2. In view of the difference in the structure on the anode side, the function of the N+type buffer regions 12 will be hereinafter described in detail with reference to FIG. 4 and FIG. 5.

Figure 4:
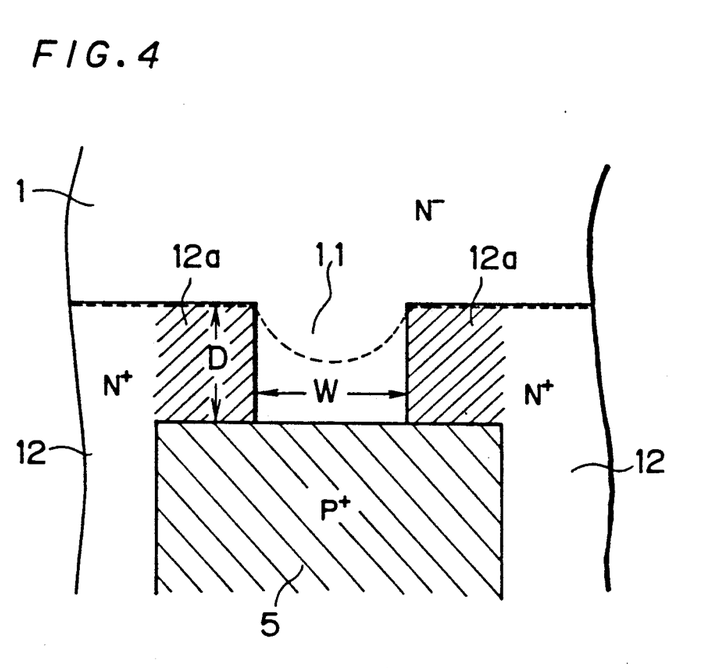
FIG. 4 is an enlarged view of an opening portion of a buffer region.

FIG. 4 is an enlarged view of the opening portion 11 shown in FIG. 3. Referring to FIG. 4, a dotted line represents a front surface of a depletion layer extending to the opening portion 11 in the off state. The front surface is equivalent to an equipotential surface, e.g., the surface has E=0. Assuming that the impurity concentration of the N+type buffer regions 12 is sufficiently higher than that of the N−type semiconductor substrate 1, the depletion layer extends only a minute amount into the N+type buffer regions 12, and hence the front surface of the depletion layer is shown to correspond to the interface between the N−type semiconductor substrate 1 and the N+type buffer regions 12 in FIG. 4. On the other hand, the depletion layer can extend into the opening portion 11. Since the P+type anode region 5 and the N+type buffer regions 12 are short-circuited, the interface between the P+type anode region 5 and the substrate 1 and the interfaces between the N+type buffer regions 12 and the substrate 1 form an equipotential surface. Therefore, the configuration of the front surface of the depletion layer in the opening portion 11 becomes curved due to the influence from the side walls of the opening portion Symbols W and D denote the width and the depth of the opening portion 11, respectively. Shaded portions of the N+type buffer regions 12 on the P+type anode region 5 are denoted and identified as portions 12a.

Figure 5A:
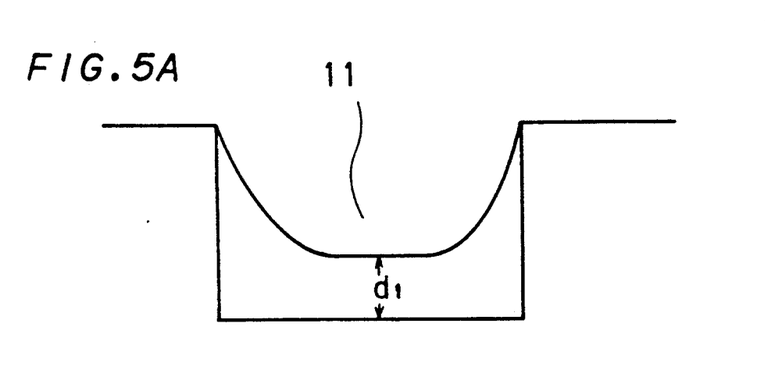
FIG. 5A to FIG. 5D are diagrams showing the variation of an extension configuration of a depletion layer into the opening portion with respect to the ratio between the width and the depth of the opening portion.

FIG. 5A to FIG. 5D are diagrams showing the variation of the extension configuration of the depletion layer into the opening portion 11, with respect to the variation of the ratio D/W between the width W and the depth D of the opening portion 11, under application of a constant reverse bias across the terminals G and K. As shown in FIG. 5A, when the ratio D/W is relatively small, the front surface of the depletion layer in the opening portion 11 has curved portions which are influenced by the side walls of the opening portion 11 and a horizontal portion which is influenced by the bottom of the opening portion 11. The horizontal portion is the nearest surface to the anode region 5. If this horizontal portion comes into contact with the anode region 5, "punch through" results.

Figure 5B:
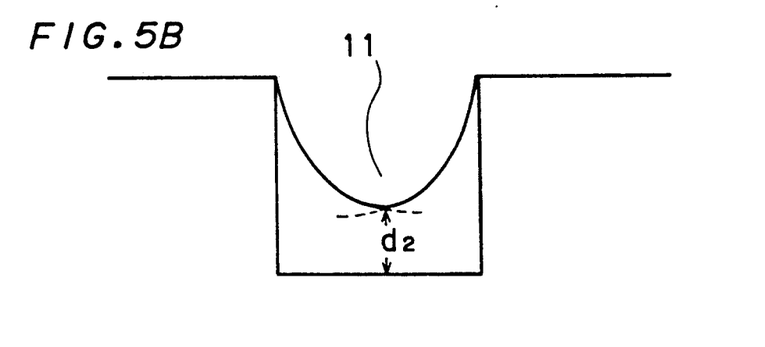
Figure 5C:
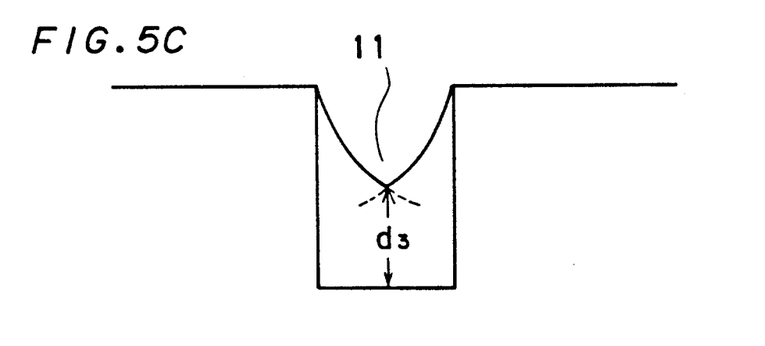
Figure 5D:
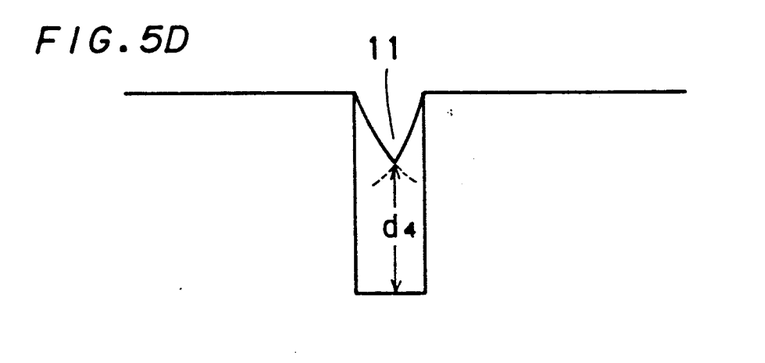

As the ratio D/W is increased, the influence from the side walls is increased, and hence the lowest portion of the depletion layer becomes a single point, as shown in FIG. 5B. When the ratio D/W is further increased, the lowest point of the depletion layer moves upwardly, away from the anode region 5, as shown in FIG. 5C and FIG. 5D. Symbols $d_1$ to $d_4$ denote the distance from the lowest surface or point of the depletion layer to the anode region 5. They have the following relation:

$$d_1 = d_2 < d_3 << d_4$$

Thus, the configuration and the depth of the extension of the depletion layer into the opening portion 11 can be controlled through adjustment of the ratio D/W. It is clear from FIG. 5A to FIG. 5D that the depth of the depletion layer extension into the opening decreases as the ratio D/W increases, under the condition that a constant reverse bias is applied across the terminals G and K. Therefore, a higher breakdown voltage can be obtained as the ratio D/W increases. In other words, the ratio D/W may be designed in accordance with a desired breakdown voltage operation. Further, if the impurity concentration of the anode covering portions 12a of the N+type buffer regions 12 is changed, the configuration of the depletion layer extension into the portion 12a varies, whereby the extension configuration of the depletion layer into the opening portion 11 also varies. Therefore, the breakdown voltage of the device can also be adjusted through the adjustment of the impurity concentration distribution in the anode covering portions 12a.

In the turn-off transition period from the "on" state to the "off" state, electrons remaining in the undepleted region after the pinch-off of a channel region 8 can easily flow into the buffer regions 12, which have positive potential. Consequently, holes remaining in the same region are rapidly ejected to gate region 7 and anode regions 5. Thus, the turn-off time is improved. Greater improvement can be obtained by widening the interface area between the substrate and the buffer regions 12. Thus, the SI thyristor according to the embodiment of FIG. 3 to FIG. 5 has an improved turn-off time in comparison with the conventional shorted emitter type SI thyristor shown in FIG. 2.

In the "on" state, holes are injected with high efficiency into the substrate 1 from the anode region 5 through the opening portion 11. Further, hole current also flows through the anode covering portions 12a of the buffer region 12. Therefore, the SI thyristor according to the embodiment can have a low "on" resistance which is lower than that of the conventional buffer layer type SI thyristor shown in FIG. 1 and approximately the same as that of shorted emitter type SI thyristor shown in FIG. 2. Further, in the turn-on transition period from the "off" state to the "on" state, holes are rapidly injected into the substrate 1 from the anode regions 5 through the opening portion 11, whereby the turn-on time is shortened. Thus, both high speed switching and low "on" resistance characteristics are obtained with the invention.

Figure 6:
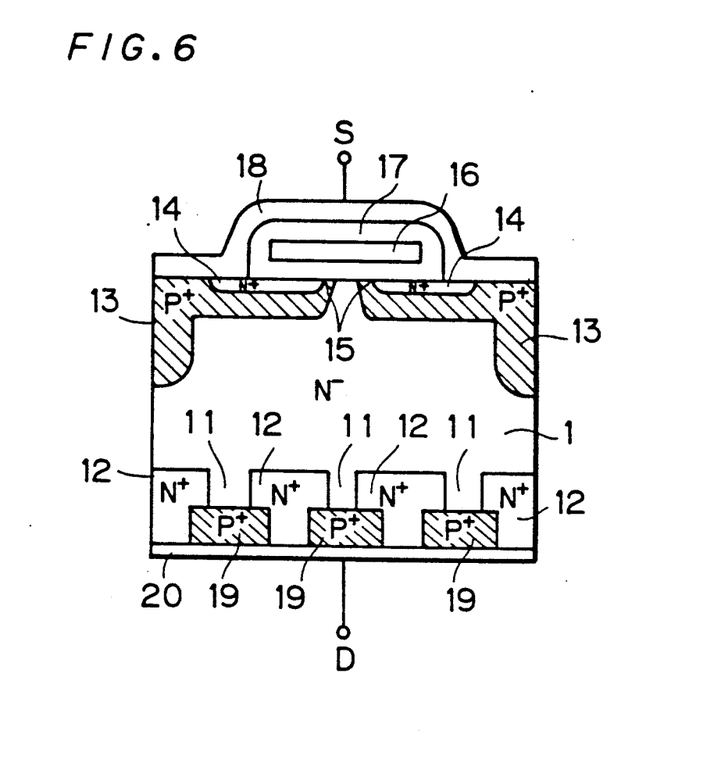
FIG. 6 is a cross sectional view showing the structure of an IGBT according to another embodiment of the bipolar semiconductor switching device in accordance with the present invention.

FIG. 6 is a cross sectional view showing the structure of an IGBT in accordance with another embodiment of a bipolar semiconductor switching device of the present invention. Referring to FIG. 6, an N−type semiconductor substrate is provided in one major surface thereof, with P+type well regions 13 which are partially provided with N+type source regions 14 of relatively low specific resistance corresponding to the cathode region 2 of the SI thyristor shown in FIG. 3. Surface regions 15 of the P+type well regions 13, between the N−type semiconductor substrate 1 and the N+type source regions 14, serve as channel regions through which the main current flows. A gate 16 is disposed over the channel regions 15. The gate 16 is covered with a insulation film 17 such as an oxide film in order to insulate the gate 16 from the N−type semiconductor substrate 1. A source contact 18, for electrically connecting the N+type source regions 14, corresponds to the cathode contact 3 of the SI thyristor shown in FIG. 3. In accordance with the present invention, the structure in the second major surface of the N−type semiconductor substrate 1 is the same as that of the SI thyristor shown in FIG. 3. Namely, N+type buffer regions 12 form opening portions 11 through which P+type drain regions 19, corresponding to the P+type anode regions 5 of the SI thyristor shown in FIG. 3, are in contact with the N−type semiconductor substrate 1. The N+type buffer regions 12 and the P+type drain regions 19 are short-circuited by a drain contact 20 corresponding to the anode contact 6 of the SI thyristor shown in FIG. 8.

The on/off operation of the IGBT is controlled by a bias applied to a gate 16, as is well known. Namely, an inversion layer appears in the channel regions 15 to turn on the IGBT when a positive bias is applied to the gate 16 and disappears to turn off the IGBT when a zero bias is applied to the gate 16. Since the gate 16 is a MOS type insulated gate, carriers remaining in the N−type semiconductor substrate 1 can not be drawn through the gate 16 after the bias applied to the gate 16 becomes zero during the turn-off transition period. Although an IGBT having a shorted drain structure similar to the SI thyristor shown in FIG. 2 is conventionally employed for decreasing the turn-off time, it is very difficult to retain compatibility with high voltage breakdown operation characteristics as hereinbefore described. Further, although an IGBT having a buffer layer structure similar to the SI thyristor shown in FIG. 1 is also conventionally employed for obtaining high breakdown voltage characteristics, it is very difficult to obtain good high speed switching characteristic as also hereinbefore described. The IGBT shown in FIG. 6 in accordance with the present invention overcomes such difficulties. It achieves good compatibility between the high voltage breakdown characteristics and the high speed switching and the low "on" resistance characteristics, similar to the SI thyristor according to the present invention shown in FIG. 3.

Figure 7:
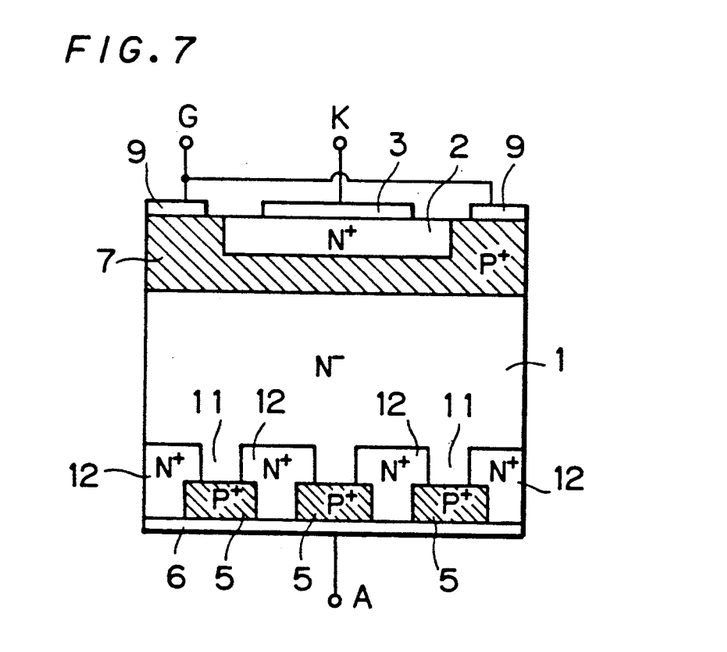
FIG. 7 is a cross sectional view showing the structure of a GTO according to still another embodiment of the bipolar semiconductor switching device in accordance with the present invention.

FIG. 7 is a cross sectional view shown the structure of a GTO according to still another embodiment of a bipolar semiconductor switching device in accordance with the present invention. The GTO has an analogous structure to that of the SI thyristor shown in FIG. 3 with the exception that an N+type cathode region 2 is surrounded by a P+type gate region 7. Main current flows through the P+type gate region 7. This GTO also has good compatibility between its high voltage breakdown characteristic and the high speed switching and the low "on" resistance characteristics.

Figure 8:
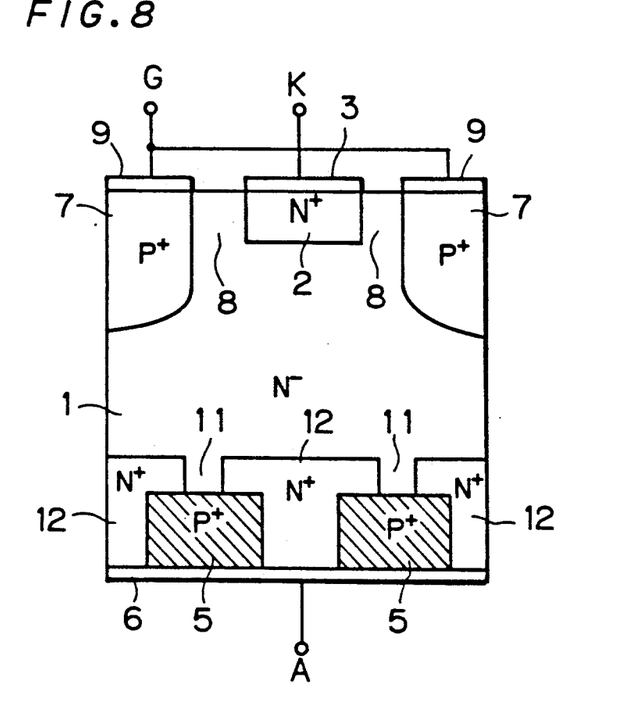
FIG. 8 is a cross-sectional view showing the structure of a surface gate type SI thyristor in accordance with the present invention.

FIG. 8 is a cross sectional view showing the structure of a surface gate type SI thyristor in accordance with the present invention. P+type gate region 7 surrounding N+type cathode region 2 is formed in the surface of an N−type semiconductor substrate 1, different from the buried gate type SI thyristor shown in FIG. 3.

Figure 9:
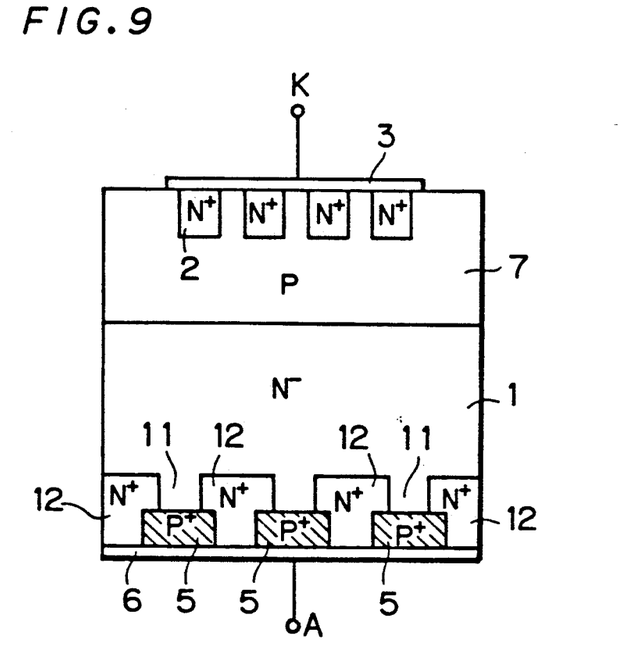
FIG. 9 is a cross-sectional view of a thyristor according to the present invention whose emitter and gate regions are short circuited.

Although the SI thyristor, the IGBT and the GTO have been described in detail, the present invention is generally applicable to various bipolar semiconductor switching devices. FIG. 9 shows an example where the present invention is applied to a general thyristor whose emitter and gate regions 2 and 7 are short-circuited with each other.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A bipolar semiconductor switching device, comprising:
   a first conductivity type semiconductor substrate having a first and a second major surface;
   a first main electrode region of a first conductivity type formed in said first major surface of said semiconductor substrate;
   a first conductivity type buffer region having relatively high impurity concentration formed in said second major surface of said second substrate, said buffer region having an opening portion of a predetermined width and a predetermined depth;
   a second main electrode region of second conductivity type formed in direct contact with said semiconductor substrate through said opening portion of said buffer region, wherein said buffer region includes a covering portion which covers a portion of said second main electrode region, wherein aid portion of said second main electrode region is substantially parallel to said second major surface;
   a connecting region for electrically connecting said buffer region and said second main electrode region with each other; and
   a control region for controlling current flowing between said first and second main electrode regions.

2. A bipolar semiconductor switching device in accordance with claim 1, wherein a breakdown voltage of the semiconductor switching device is adjustable by adjusting an impurity concentration distribution in said covering portion of said buffer region.

3. A bipolar semiconductor switching device in accordance with claim 1, wherein
   said device includes a static induction thyristor, and
   said control region comprises a second conductivity type gate region formed in said semiconductor substrate and a channel region surrounded by said gate region.

4. A bipolar semiconductor switching device in accordance with claim 1, wherein
   said device includes an insulated gate bipolar transistor, and
   said control region comprises a well region of second conductivity type surrounding said first main electrode region wherein a surface portion of said well region between said semiconductor substrate and said first main electrode region forms a channel region and wherein an insulated gate region is provided over said channel region.

5. A bipolar semiconductor switching device in accordance with claim 1, wherein
   said device includes a gate turn-off thyristor, and
   said control region comprises a second conductivity type gate region surrounding said first main electrode region.

* * * * *

UNITED STATES PATENT AND TRADEMARK OFFICE
CERTIFICATE OF CORRECTION

PATENT NO. : 5,086,330
DATED : FEBRUARY 4, 1992
INVENTOR(S) : MINATO

It is certified that error appears in the above-indentified patent and that said Letters Patent is hereby corrected as shown below:

```
     Column 2, line 1, change "and K" to --G and K--;
         line 6, change "region 5" to --region 5.--.
     Column 3, line 4, change "of type" to --of P type--.
     Column 4, line 32, change "N+ type" to --N- type--.
     Column 6, line 6, change "area between" to --area, which
is not only the horizontal portions but also the vertical
portions, between--.
     Column 7, line 39, change "emitter" to --cathode--.
     Column 8, line 6, change "said second substrate" to
--said semiconductor substrate--;
         line 14, change "aid" to --said--;
         line 38, change "well" to --well or body--.

In Figure 8, change the reference number 8 as shown on
the attached sheet.
```

Signed and Sealed this

Second Day of April, 1996

BRUCE LEHMAN

*Attest:*

*Attesting Officer*   Commissioner of Patents and Trademarks

FIG. 8